(12) United States Patent
Lin et al.

(10) Patent No.: US 8,749,048 B2
(45) Date of Patent: Jun. 10, 2014

(54) PACKAGE STRUCTURE

(75) Inventors: Diann-Fang Lin, Zhubei (TW);
Yu-Shan Hu, Yangmei Township, Taoyuan County (TW)

(73) Assignee: ADL Engineering Inc., Hsinchu County (TW)

( * ) Notice: Subject to any disclaimer, the term of this patent is extended or adjusted under 35 U.S.C. 154(b) by 659 days.

(21) Appl. No.: 13/091,484

(22) Filed: Apr. 21, 2011

(65) Prior Publication Data

US 2011/0193216 A1 Aug. 11, 2011

Related U.S. Application Data

(62) Division of application No. 12/615,682, filed on Nov. 10, 2009, now Pat. No. 8,058,102.

(51) Int. Cl.
*H01L 23/48* (2006.01)

(52) U.S. Cl.
USPC ........... 257/698; 257/692; 257/737; 257/738; 257/773; 257/E23.011

(58) Field of Classification Search
USPC ........... 257/698, 692, 737, 738, 773, E23.011
See application file for complete search history.

(56) References Cited

U.S. PATENT DOCUMENTS

2010/0301474 A1 12/2010 Yang .............................. 257/737
2011/0042798 A1 2/2011 Pagaila et al. ................. 257/692

*Primary Examiner* — Long Pham
(74) *Attorney, Agent, or Firm* — Kusner & Jaffe

(57) ABSTRACT

The present invention discloses a semiconductor device package structure with redistribution layer (RDL) and through silicon via (TSV) techniques. The package structure comprises an electronic element which includes an dielectric layer on a backside surface of the electronic element, a plurality of first conductive through vias across through the electronic element and the dielectric layer, and a plurality of conductive pads accompanying with the first conductive through vias on an active surface of the electronic element; a filler material disposed adjacent to the electronic element; a first redistribution layer disposed over the dielectric layer and the filler material, and connected to the first conductive through vias; a first protective layer disposed over the active surface of the electronic element, the conductive pads, and the filler material; and a second protective layer disposed over the redistribution layer, the dielectric layer, and the filler material.

13 Claims, 5 Drawing Sheets

PACKAGE STRUCTURE

RELATED APPLICATIONS

The present application is a divisional application of U.S. application Ser. No. 12/615,682, entitled "Package Structure and Manufacturing Method thereof," and filed on Nov. 10, 2009 now U.S. Pat. No. 8,058,102, which is incorporated herein by reference in its entirety.

FIELD OF THE INVENTION

This invention relates to a structure of package, and more particularly to a semiconductor device package structure with redistribution layers (RDL) and through silicon via (TSV) techniques.

BACKGROUND OF THE INVENTION

In recent years, the high-technology electronics manufacturing industries launch more feature-packed and humanized electronic products. These new products that hit the showroom are lighter, thinner, and smaller in design. In the manufacturing of these electronic products, the key component has to be the integrated circuit (IC) chip inside any electronic product.

Rapid development of semiconductor technology has led to rapid progress of a reduction in size of semiconductor packages, the adoption of multi-pin, the adoption of fine pitch, the minimization of electronic components and the like. The purposes and the advantages of wafer level package includes decreasing the production cost, decreasing the effect caused by the parasitic capacitance and parasitic inductance by using the shorter conductive line path, acquiring better SNR (i.e. signal to noise ratio). Furthermore, the size of a wafer-level package product is close to the size of a chip, and therefore, the size of the chip determines the package volume.

Conventionally, the function of chip package includes power distribution, signal distribution, heat dissipation, protection and support. As a semiconductor become more complicated, the traditional package technique, for example lead frame package, flex package, rigid package technique, can't meet the demand of producing smaller chip with high density element on the chip.

The chip-scale package (CSP) has been conventionally formed by a method in which a semiconductor wafer is cut into semiconductor chips, then the semiconductor chips are mounted on a base substrate serving as a package base at predetermined positions and bonded thereto, and they are collectively sealed with a resin, thereafter the sealing resin and the base substrate are cut into pieces together at the parts between the semiconductor chips. In another conventional method, a semiconductor wafer (not being cut into semiconductor chips yet) is mounted on a base substrate and bonded thereto, then the semiconductor wafer and the base substrate are cut simultaneously, and the cut and divided semiconductor chips and package bases are sealed with a resin.

Further, the operability, performance, and life of an IC chip are greatly affected by its circuit design, wafer manufacturing, and chip packaging. For this present invention, the focus will be on chip packaging technique. Since the features and speed of IC chips are increasing rapidly, the need for increasing the conductivity of the circuitry is necessary so that the signal delay and attenuation of the dies to the external circuitry are reduced. A chip package that allows good thermal dissipation and protection of the IC chips with a small overall dimension of the package is also necessary for higher performance chips. These are the goals to be achieved in chip packaging.

There are a vast variety of existing chip package techniques such as ball grid array (BGA), wire bonding, flip chip for mounting a die on a substrate via the bonding points on both the die and the substrate. The inner traces help to fan out the bonding points on the bottom of the substrate. The solder balls are separately planted on the bonding points for acting as an interface for the die to electrically connect to the external circuitry. Similarly, pin grid array (PGA) is very much like BGA, which replaces the balls with pins on the substrate and PGA also acts an interface for the die to electrically connect to the external circuitry.

Both BGA and PGA packages require wiring or flip chip for mounting the die on the substrate. The inner traces in the substrate fan out the bonding points on the substrate, and electrical connection to the external circuitry is carried out by the solder balls or pins on the bonding points. As a result, this method fails to reduce the distance of the signal transmission path but in fact increase the signal path distance. This will increase signal delay and attenuation and decrease the performance of the chip.

However, in the manufacturing method, wafer level chip scale package (WLCSP) has an advantage of being able to print the redistribution circuit directly on the die by using the peripheral area of the die as the bonding points. It is achieved by redistributing an area array on the surface of the die, which can fully utilize the entire area of the die. The bonding points are located on the redistribution circuit by forming flip chip bumps so the bottom side of the die connects directly to the printed circuit board (PCB) with micro-spaced bonding points.

Although WLCSP can greatly reduce the signal path distance, it is still very difficult to accommodate all the bonding points on the die surface as the integration of die and internal components gets higher. The pin count on the die increases as integration gets higher so the redistribution of pins in an area array is difficult to achieve. Even if the redistribution of pins is successful, the distance between pins will suffer yield and reliability issues owing to the huge size of package. The further disadvantage of former method are higher costs and time-consuming for manufacture.

Therefore, the present invention provides a new structure and method for a package that minimizes the thickness of package structure for a wafer level package to overcome the aforementioned problem.

SUMMARY OF THE INVENTION

In view of foregoing, the present invention provides a semiconductor device package structure, which is utilized by redistribution layer (RDL) and through silicon via (TSV) techniques and minimizes the thickness of package structure for a wafer level chip scale package.

An object of the present invention is to provide a structure for chip scale package, which can allow minimizing the size of chip scale package.

A further object of the present invention is to provide a structure for producing smaller chip with high pin count or high density elements on the chip, high performance and high reliability package.

In one aspect, a semiconductor device package structure according to the present invention, comprising: an electronic element which includes an dielectric layer on a backside surface of the electronic element, a plurality of first conductive through vias across through the electronic element and the dielectric layer, and a plurality of conductive pads accompanying with the first conductive through vias on an active surface of the electronic element; a filler material disposed adjacent to the electronic element; a first redistribution layer disposed over the dielectric layer and the filler material, and connected to the first conductive through vias; a first protective layer disposed over the active surface of the electronic element, the conductive pads, and the filler material; a second protective layer disposed over the redistribution layer, the dielectric layer, and the filler material; and a plurality of conductive balls disposed on the second protective layer and connected to the first redistribution layer.

In certain embodiments of the present invention, the package structure further comprises: a second redistribution layer disposed over the first protective layer, and connected to the conductive pads; a third protective layer disposed over the second redistribution layer and the first protective layer; and a plurality of solder bumps disposed on the third protective layer and connected to the second redistribution layer. In another certain embodiments of the present invention, the package structure further comprises: a second redistribution layer disposed over the first protective layer, and connected to the conductive pads; a third protective layer disposed over the second redistribution layer and the first protective layer; a plurality of second conductive through vias across through the filler material and connected to the second redistribution layer; a third redistribution layer in the second protective layer and connected to the second conductive through vias; and a plurality of conductive balls disposed on the second protective layer and connected to the third redistribution layer.

A detailed description is given in the following embodiments and with references to the accompanying drawings and claims.

DETAILED DESCRIPTION OF THE PREFERRED EMBODIMENT

The invention hereinafter will be described in greater detail with preferred embodiments of the invention and accompanying illustrations. Nevertheless, it should be recognized that the preferred embodiments of the invention are not provided to limit the invention but to illustrate it. The present invention can be practiced not only in the preferred embodiments herein mentioned, but also in a wide range of other embodiments besides those explicitly described. Further, the scope of the present invention is expressly not limited to any particular embodiments except what is specified in the appended claims.

The present invention discloses a semiconductor device package structure utilizing the techniques of redistribution layer (RDL) and through silicon via (TSV) for producing smaller chip with high pin count or high density elements on the chip. Moreover, the package structure utilized to stacking multi-chips package structure.

Figure 1:
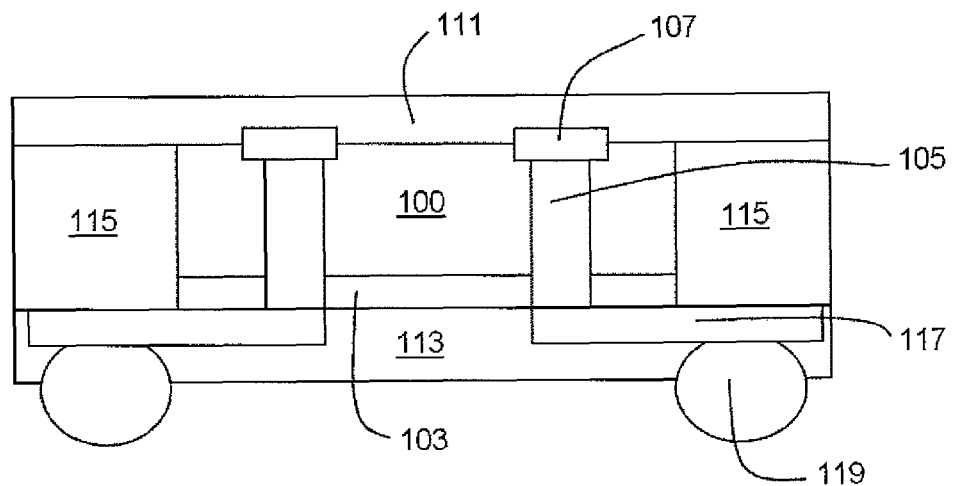
FIG. 1 is a diagram of a semiconductor device package structure according to the first embodiment of the present invention.

Regarding to FIG. 1, which illustrates a cross-sectional view of a semiconductor device package structure according to the first embodiment of the present invention. As shown in the FIG. 1, a semiconductor device package structure includes an electronic element 100, which comprises an active surface and a backside surface and includes a dielectric (isolation) layer 103 formed on the backside surface of the electronic element 100. A plurality of conductive through vias 105 cross through the electronic element 100 and the dielectric layer 103, and a plurality of conductive pads 107 accompany with the conductive through vias 105 disposed on the active surface of the electronic element 100. A filler 115 is adjacent to the side wall of the electronic element 100 and the side wall of the dielectric layer 103. A redistribution layer 117 is formed under the dielectric layer 103 and connects to the conductive through vias 105. A first protective layer 111 is formed to cover and protect the active surface of electronic element 100, the conductive pads 107, and partly of the filler 115. A second protective layer 113 is formed to cover and protect the redistribution layer 117, the exposed part of the dielectric layer 103, and partly of the filler 115. A plurality of conductive balls formed in the second protective layer 113 and connected to the redistribution layer 117.

In this embodiment, the electronic element 100 comprises a semiconductor die or a semiconductor chip. The pluralities of conductive through vias 105 of the electronic element 100 are aligned to the conductive pads 107. The conductive pads 107 are bonding pads, terminal contact pads or I/O pads. The dielectric layer 103 formed on the backside surface of the electronic element 100 is utilized to prevent the edge crack of the electronic element 100 when the dicing process.

In certain embodiments of the present invention, the conductive pads 107 could be aluminum (Al), copper (Cu) pads, other metal pads or the combination thereof. The materials of the conductive through vias 105 comprise Al, Cu, tin (Sn), nickel (Ni), gold (Au), silver (Ag) or the combination thereof The dielectric layer 103 comprises an elastic material or photosensitive material. In certain embodiments of the present invention, the dielectric layer 103 can be made with silicon dioxide ($SiO_2$), silicon nitride ($Si_xN_y$), silicon oxynitride (SiON), polyimide (PI), benzocyclobutene (BCB), polybenzoxazole (PBO), epoxy, or other insulating material. The filler 115 also refers to as core pastes. In certain embodiments of the present invention, the filler 115 can be formed by resin, compound, silicon rubber, polyimide (PI) or epoxy. The redistribution layer 117 also refers to as conductive trace. In certain embodiments of the present invention, the materials of the redistribution layer 117 comprise Al, Ni, Au, aluminum copper alloy (AlCu), Cu, or Cu alloy.

In certain embodiments of the present invention, the first and second protective layers 111 and 113 are preferably a dielectric material which is made by silicone dielectric based materials, such as siloxane polymers (SINR). In another certain embodiments of the present invention, the first and second protective layers 111 and 113 are made by a material, such as PI, bismaleimide triazine (BT), silicon rubber, epoxy, or silicon resin. Moreover, the materials of the first and second protective layers 111 and 113 comprise transparent material from soft or hard type. In certain embodiments of the present invention, the semiconductor device package structure further comprises a gap between the first protective layer 111 and the electronic element 100.

The conductive ball 119 comprises solder bumps. In certain embodiments of the present invention, the materials of the conductive ball 119 can be any metal alloy or electrically conductive material, e.g., Sn, lead (Pb), Ni, Au, Ag, Cu, bismuthinite (Bi), and alloys thereof.

Figure 2:
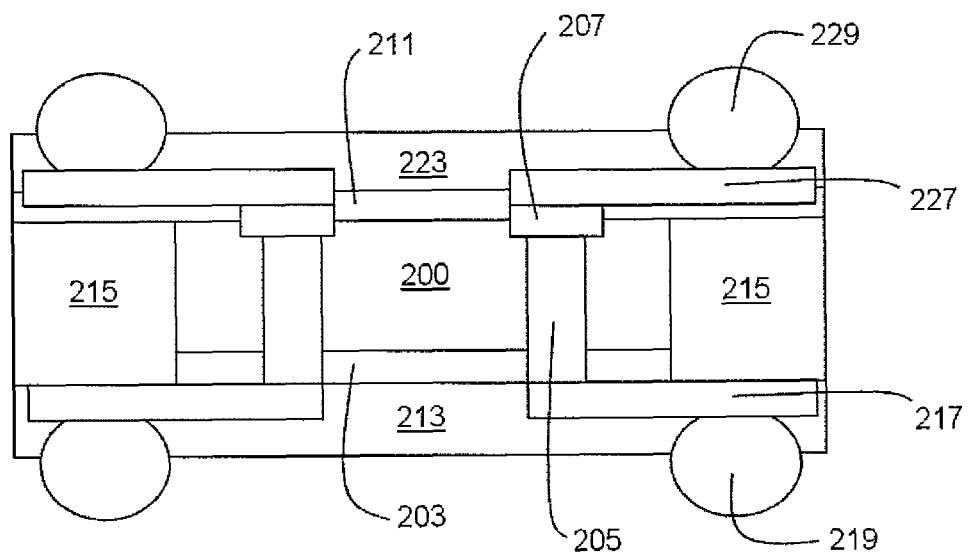
FIG. 2 is a diagram of a stacked semiconductor device package structure according to the second embodiment of the present invention.

Regarding to FIG. 2, which illustrates a cross-section view of a stacked semiconductor device package structure according to the second embodiment of the present invention. As shown in FIG. 2, a stacked semiconductor device package structure includes electronic element 200, which comprises an active surface and a backside surface and includes a dielectric (isolation) layer 203 formed on the backside surface of the electronic element 200. A plurality of conductive through vias 205 cross through the electronic element 200 and the dielectric layer 203, and a plurality of conductive pads 207 accompany with the conductive through vias 205 disposed on the active surface of the electronic element 200. A filler 215 is adjacent to the side wall of the electronic element 200 and the side wall of the dielectric layer 203. A first redistribution layer 217 is formed under the dielectric layer 203 and connects to the conductive through vias 205. A first protective layer 211 is formed to cover and protect the active surface of electronic element 200, and partly of the filler 215. A second redistribution layer 227 is formed over the first protective layer 211 and connects to the conductive pads 207. A second protective layer 213 is formed to cover and protect the first redistribution layer 217, the exposed part of the dielectric layer 203, and partly of the filler 215. A plurality of first conductive balls 219 formed in the second protective layer 213 and connected to the first redistribution layer 217. A third protective layer 223 is formed to cover and protect the second redistribution layer 227 and the exposed first protective layer 211. A plurality of second conductive balls 229 formed in the third protective layer 223 and connected to the second redistribution layer 227.

In this embodiment, the electronic element 200 comprises a semiconductor die or a semiconductor chip. The pluralities of conductive through vias 205 of the electronic element 200 are aligned to the conductive pads 207. The conductive pads 207 are bonding pads, terminal contact pads or I/O pads. The dielectric layer 203 formed on the backside surface of the electronic element 200 is utilized to prevent the edge crack of the electronic element 200 when the dicing process.

In certain embodiments of the present invention, the conductive pads 207 could be Al, Cu pads, other metal pads or the combination thereof. The materials of the conductive through vias 205 comprise Al, Cu, Sn, Ni, Au, Ag or the combination thereof. The dielectric layer 203 comprises an elastic material or photosensitive material. In certain embodiments of the present invention, the dielectric layer 203 can be made with $SiO_2$, $Si_xN_y$, SiON, PI, BCB, PBO, epoxy, or other insulating material. The filler 215 also refers to as core pastes. In certain embodiments of the present invention, the filler 215 can be formed by resin, compound, silicon rubber PI, or epoxy. The first and second redistribution layers 217 and 227 also refer to as conductive trace. In certain embodiments of the present invention, the materials of the first and second redistribution layer 217 and 227 comprise Al, Ni, Au, AlCu, Cu, or Cu alloy.

In certain embodiments of the present invention, the first, second and third protective layers 211, 213, and 223 are preferably a dielectric material which is made by silicone dielectric based materials, such as SINR. In another certain embodiments of the present invention, the first, second and third protective layers 211, 213, and 223 are made by a material, such as PI, BT, silicon rubber, epoxy, or silicon resin. Moreover, the materials of the first, second and third protective layers 211, 213, and 223 comprise transparent material from soft or hard type. In certain embodiments of the present invention, the semiconductor device package structure further comprises a gap between the first protective layer 211 and the electronic element 200.

The first and second conductive balls 219 and 229 comprise solder bumps. In certain embodiments of the present invention, the materials of the first and second conductive ball 219 and 229 can be any metal alloy or electrically conductive material, e.g., Sn, Pb, Ni, Au, Ag, Cu, Bi, and alloys thereof.

Figure 3:
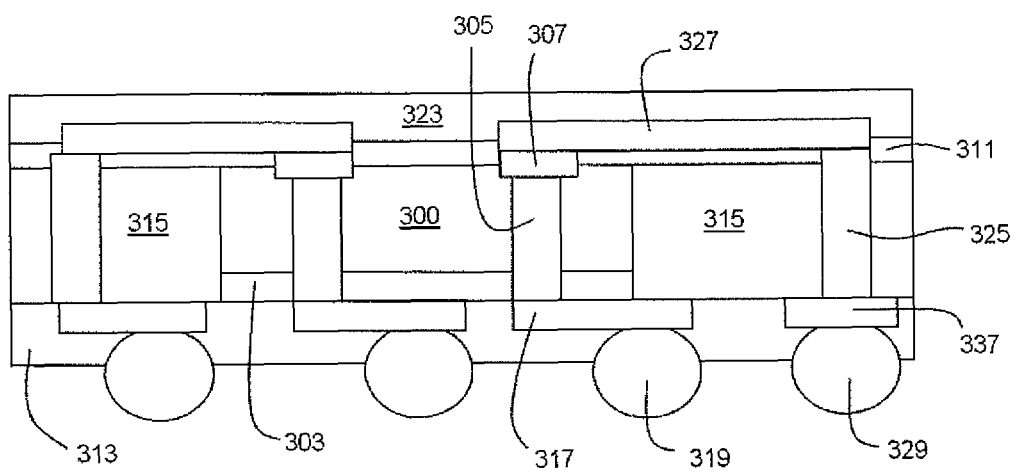
FIG. 3 is a diagram of a semiconductor device package structure according to the third embodiment of the present invention.

Regarding to FIG. 3, which illustrates a cross-section view of a semiconductor device package structure according to the third embodiment of the present invention. As shown in FIG. 3, a semiconductor device package structure includes electronic element 300, which comprises an active surface and a backside surface and includes a dielectric (isolation) layer 303 formed on the backside surface of the electronic element 300. A plurality of first conductive through vias 305 cross through the electronic element 300 and the dielectric layer 303, and a plurality of conductive pads 307 accompany with the first conductive through vias 305 disposed on the active surface of the electronic element 300. A filler 315 is adjacent to the side wall of the electronic element 300 and the side wall of the dielectric layer 303. A first redistribution layer 317 is formed under the dielectric layer 303 and connects to the conductive through vias 305. A plurality of second conductive through vias 325 further formed across through the filler 315. A first protective layer 311 is formed to cover and protect the active surface of electronic element 300, and partly of the filler 215. A second redistribution layer 327 is formed over the first protective layer 311 and connects to the conductive pads 307 and the second conductive through vias 325. A third redistribution layer 337 is formed over the filler 315 and connects to the second conductive through vias 325. A second protective layer 313 is formed to cover and protect the first and third redistribution layers 317 and 337, the exposed part of the dielectric layer 303, and partly of the filler 315. A third protective layer 323 is formed to cover and protect the second redistribution layer 327 and the exposed first protective layer 311. A plurality of first conductive balls 319 formed in the second protective layer 313 and connected to the first redistribution layer 317, and a plurality of second conductive balls 329 also formed in the second protective layer 313 and connected to the third redistribution layer 337.

In this embodiment, the electronic element 300 comprises a semiconductor die or a semiconductor chip. The pluralities of first conductive through vias 305 of the electronic element 300 are aligned to the conductive pads 307. The conductive pads 307 are bonding pads, terminal contact pads or I/O pads. The dielectric layer 303 formed on the backside surface of the electronic element 300 is utilized to prevent the edge crack of the electronic element 300 when the dicing process.

In certain embodiments of the present invention, the conductive pads 307 could be Al, Cu pads, other metal pads or the combination thereof. The materials of the first and second conductive through vias 305 and 325 comprise Al, Cu, Sn, Ni, Au, Ag or the combination thereof. The dielectric layer 303 comprises an elastic material or photosensitive material. In certain embodiments of the present invention, the dielectric layer 303 can be made with $SiO_2$, $Si_xN_y$, SiON, PI, BCB, PBO, epoxy, or other insulating material. The filler 315 also refers to as core pastes. In certain embodiments of the present invention, the filler 315 can be formed by resin, compound, silicon rubber, PI or epoxy. The first, second and third redistribution layers 317, 327, and 337 also refer to as conductive trace. In certain embodiments of the present invention, the materials of the first, second, and third redistribution layer 317, 327, and 337 comprise Al, Ni, Au, AlCu, Cu, or Cu alloy.

In certain embodiments of the present invention, the first, second and third protective layers 311, 313, and 323 are preferably a dielectric material which is made by silicone dielectric based materials, such as SINR. In another certain embodiments of the present invention, the first, second and third protective layers 311, 313, and 323 are made by a material, such as PI, BT, silicon rubber, epoxy, or silicon resin. Moreover, the materials of the first, second and third protective layers 311, 313, and 323 comprise transparent material from soft or hard type. In certain embodiments of the present invention, the semiconductor device package structure further comprises a gap between the first protective layer 311 and the electronic element 300.

The first and second conductive balls 319 and 329 comprise solder bumps. In certain embodiments of the present invention, the materials of the first and second conductive ball 319 and 329 can be any metal alloy or electrically conductive material, e.g., Sn, Pb, Ni, Au, Ag, Cu, Bi, and alloys thereof.

Figure 4:
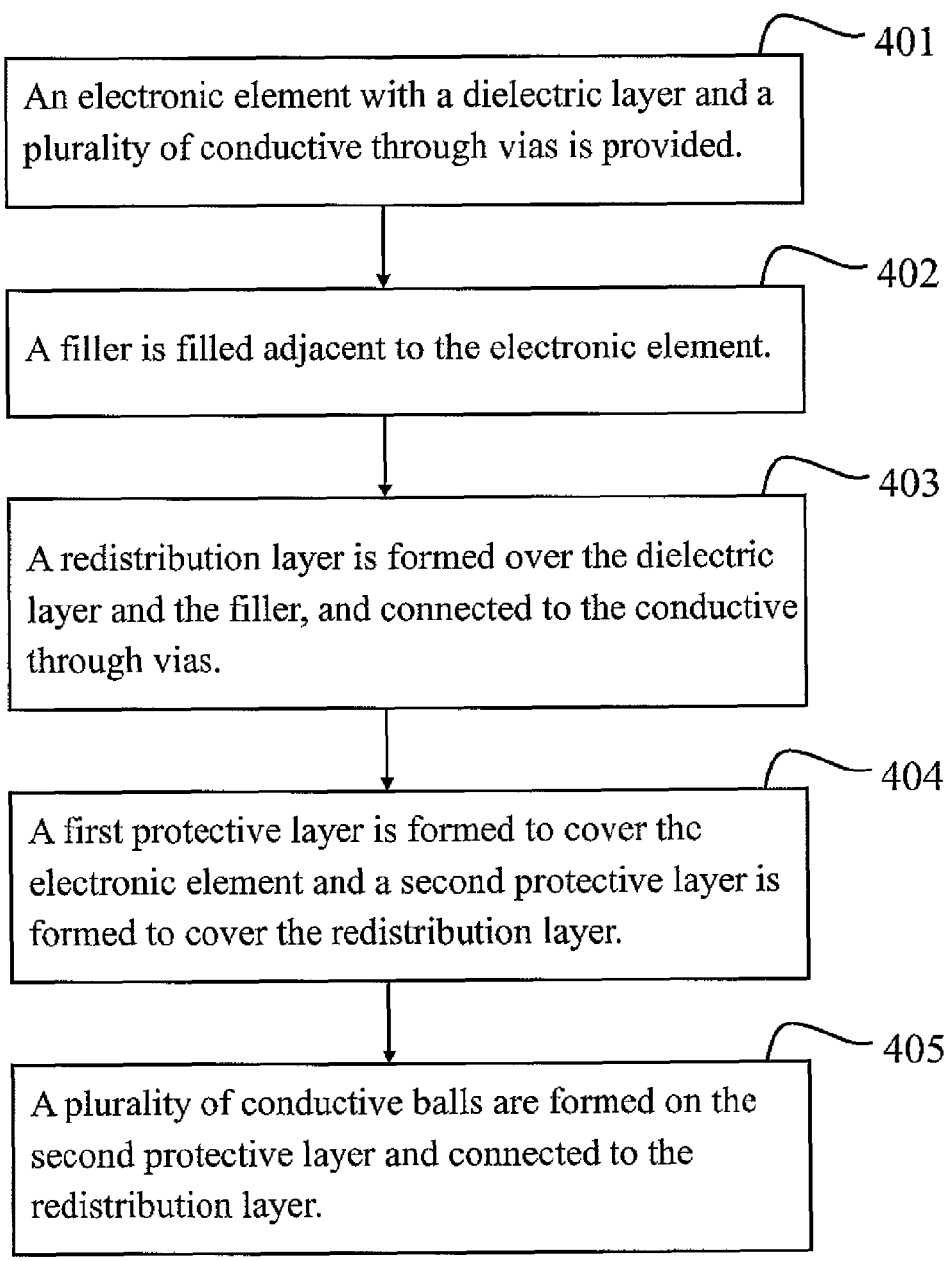
FIG. 4 is a flowchart of manufacturing process of a semiconductor device package structure according to the first embodiment of the present invention.

FIG. 4 shows process steps for manufacturing a semiconductor device package structure according to the first embodiment of the present invention, and illustrates accompanying with FIG. 1 as following:

In the step 401, it shows an electronic element 100 with a dielectric layer 103 and plurality of conductive through vias 105 is provided. A semiconductor wafer generally includes an active surface having semiconductor device disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation. Each semiconductor die of the wafer contains electronic circuits and an optical sensor or optically sensitive region or optically active region to sense light and convert the light energy to electrical signals for further processing by the electronic circuitry on the die. The electric circuits are typically complementary metal oxide semiconductor (CMOS) devices and the optical devices can be charge-coupled devices (CCD).

In this embodiment, the electronic element 100 comprises an active surface and a backside surface, and the dielectric layer 103 is formed on the backside surface of the electronic element 100. The electronic element 100 further comprises a plurality of conductive pads 107 are formed on the active surface of the electronic element 100 and aligned to the plurality of conductive through vias 105. In this embodiment, the dielectric layer 103 is formed for preventing the edge crack of the electronic element 100 when dicing process of a wafer, and the dielectric layer 103 can be formed over the wafer by printing or lamination. The conductive through vias 105 are formed in the electronic element 100 by etching or laser drilling, then filled conductive material in the vias. The conductive material can be Al, Cu, Sn, Ni, Au, Ag or the combination thereof.

In the step 402, it shows a filler 115 is filled adjacent to the electronic element 100. The filler 115 also refers to a core paste for encapsulating the electronic element 100. In this embodiment, the filler 115 is formed adjacent to the side wall of the electronic element 100 and the side wall of the dielectric layer 103. In certain embodiments of the present invention, the filling process can be performed by transfer molding or injection molding.

In the step 403, it shows a redistribution layer 117 is formed over the dielectric layer 103 and the filler 115, and connected to the conductive through vias 105. In this embodiment, the conductive through vias are across through the electronic element 100 and the dielectric layer 103. The redistribution layer 117 can be formed by an electroplating, plating or etching method. In certain embodiments of the present invention, the copper (and/or nickel) electroplating operation continues until the copper layer has the desired thickness. In another certain embodiments of the present invention, the deposition of the redistribution layer 117 uses a physical vapor deposition (PVD), CVD, evaporation, electrolytic plating, or electroless plating process.

In the step 404, it shows a first protective layer 111 is formed to cover the electronic element 100 and a second protective layer 113 is formed to cover the redistribution layer 117. In this embodiment, the first protective layer 111 is formed for covering and protecting the electronic element 100, and the second protective layer 113 is formed for covering and protecting the redistribution layer 117. The first protective layer 111 covers the conductive pads 107, the active surface of the electronic element 100 and partly of the filler 115. The second protective layer 113 covers the redistribution layer 117, the exposed dielectric layer 103 and partly of the filler 115. In certain embodiments of the present invention, the first protective layer 111 and the second protective layer 113 can be formed by molding or gluing method (dispensing or printing).

In step 405, it shows a plurality of conductive balls 119 are formed on the second protective layer 113 and connected to the redistribution layer 117. The plurality of conductive balls 119 are formed after a plurality of openings of the second protective layer 113 are formed to expose partly section of the redistribution layer 117. The conductive balls 119 are formed to electrically connect the conductive pads 107 of the electronic element 100 by the conductive through vias 107 and the redistribution layer 117. In certain embodiments of the present invention, the conductive balls 119 comprise solder bumps. The solder bumps are electrically and mechanically connected to contact the redistribution layer by a solder reflow process. In another certain embodiments of the present invention, the conductive balls 119 are reflowed by heating the conductive material above its melting point to form spherical balls or bumps. In some applications, the conductive balls 119 are reflowed a second time to improve electrical contact to the redistribution layer 117.

Figure 5:
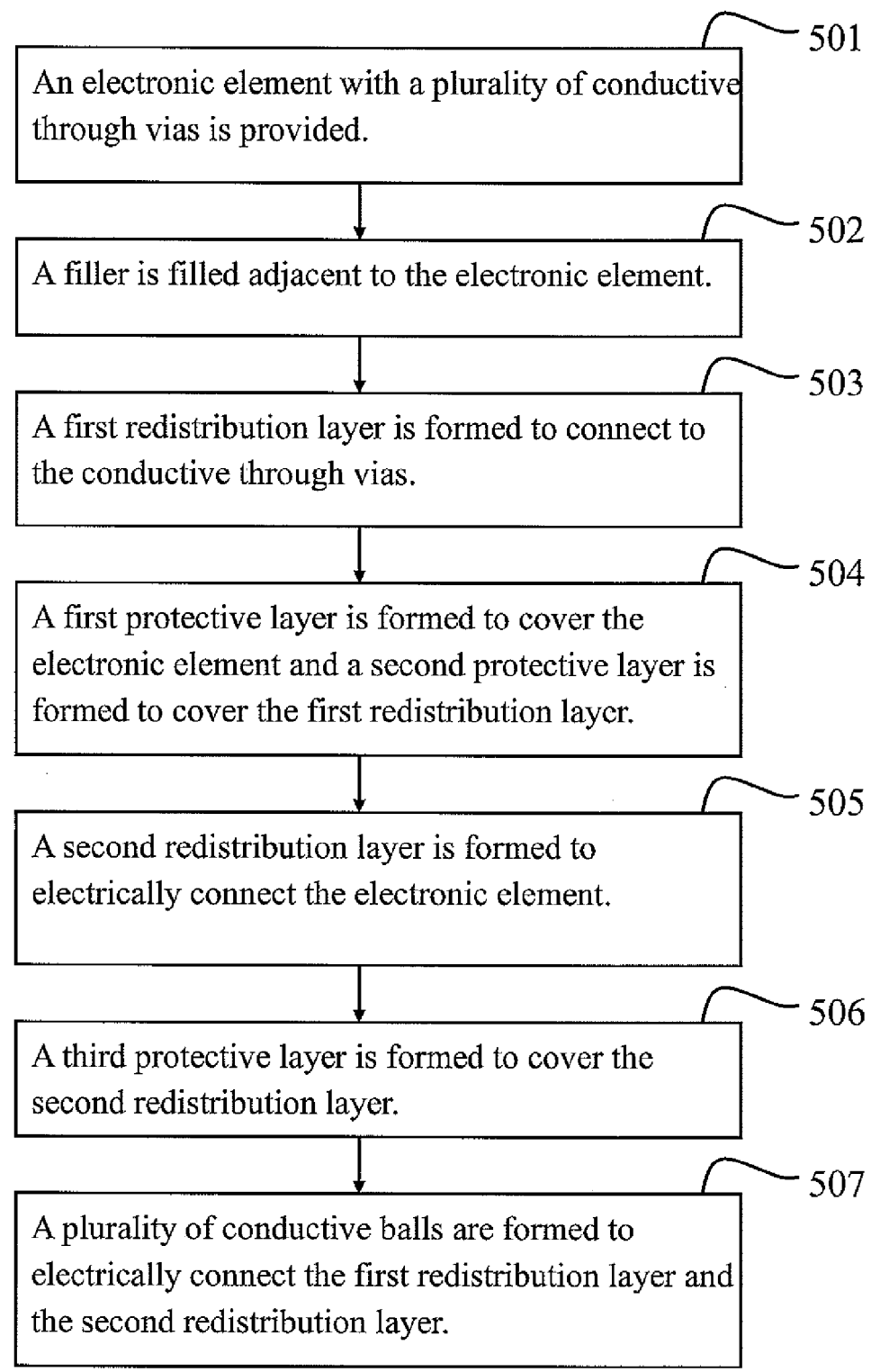
FIG. 5 is a flowchart of manufacturing process of a semiconductor device package structure according to the second embodiment of the present invention.

FIG. 5 shows process steps for manufacturing a stacked semiconductor device package structure according to the second embodiment of the present invention, and illustrates accompanying with FIG. 2 as following:

In step 501, it shows an electronic element 200 with a plurality of conductive through vias 205 is provided. In this embodiment, the electronic element 200 comprises an active surface and a backside surface. The electronic element 200 further comprises a dielectric layer 203 is formed on the backside surface of the electronic element 200 and a plurality of conductive pads 207 are aligned to the plurality of conductive through vias 205. The conductive through vias 205 are across through the electronic element 200 and the dielectric layer 203. In this embodiment, the dielectric layer 203 is formed for preventing the edge crack of the electronic element 200 at dicing or cutting process, and the dielectric layer 203 can be formed over the wafer by printing or lamination.

In step 502, it shows a filler 215 is filled adjacent to the electronic element 200. The filler 215 also refers to a core paste for encapsulating the electronic element 200. In this embodiment, the filler 215 is formed adjacent to the side wall of the electronic element 200 and the side wall of the dielectric layer 203. In certain embodiments of the present invention, the filling process can be performed by transfer molding or injection molding.

In step 503, it shows a first redistribution layer 217 is formed to connect to the conductive through vias 205. In this embodiment, the first redistribution layer 217 is formed over the conductive through vias 205, partly surface of dielectric layer 203, and partly surface of the filler 215. The first redistribution layer 217 is formed by an electroplating, plating or etching method. In certain embodiments of the present invention, the copper (and/or nickel) electroplating operation continues until the copper layer has the desired thickness. In another certain embodiments of the present invention, the deposition of the first redistribution layer 217 uses PVD, CVD, evaporation, electrolytic plating, or electroless plating process.

In step 504, it shows a first protective layer 211 is formed to cover the electronic element 200 and a second protective layer 213 is formed to cover the first redistribution layer 217. In this embodiment, the first protective layer 211 is formed for covering and protecting the active surface of electronic element 200 and the conductive pads 207; and the second protective layer 213 is formed for covering and protecting the redistribution layer 217. In certain embodiments of the present invention, the first protective layer 211 and the second protective layer 213 can be formed by molding or gluing method (dispensing or printing).

In step 505, it shows a second redistribution layer 227 is formed to electrically connect the electronic element 200. In this embodiment, the second redistribution layer 227 is formed over the first protective layer 211 and connected to the conductive pads 207 of the electronic element 200. The second redistribution layer 227 is formed after a plurality of openings of the first protective layer 211 formed for exposing the plurality of conductive pads 207. The second redistribution layer 227 is formed by an electroplating, plating or etching method. In certain embodiments of the present invention, the copper (and/or nickel) electroplating operation continues until the copper layer has the desired thickness. In another certain embodiments of the present invention, the deposition of the second redistribution layer 227 uses PVD, CVD, evaporation, electrolytic plating, or electroless plating process.

In step 506, it shows a third protective layer 223 is formed to cover the second redistribution layer 227. In this embodiment, the third protective layer 223 is formed for covering and protecting the second redistribution layer 227. In certain embodiments of the present invention, the third protective layer 223 can be formed by molding or gluing method (dispensing or printing).

In step 507, it shows a plurality of conductive balls 219 and 229 are formed to electrically connect the first redistribution layer 217 and the second redistribution layer 227. The plurality of first conductive balls 219 are formed after a plurality of openings of the second protective layer 213 are formed to expose partly section of the first redistribution layer 217; and the plurality of second conductive balls 229 are formed after a plurality of openings of the third protective layer 223 are formed to expose partly section of the second redistribution layer 227. In certain embodiments of the present invention, the first and second conductive balls 219 and 229 comprise solder bumps. The solder bumps are electrically and mechanically connected to contact the redistribution layer by a solder reflow process. In another certain embodiments of the present invention, the first and second conductive balls 219 and 229 are reflowed by heating the conductive material above its melting point to form spherical balls or bumps. In some applications, the first and second conductive balls 219 and 229 are reflowed a second time to improve electrical contact to the first redistribution layer 217 and the second redistribution layer 227.

Then, the stacked semiconductor device package structure as above mentioned, can stacking connect to the other semiconductor device package utilizing to the first conductive balls 219 and the second conductive balls 229.

Figure 6:
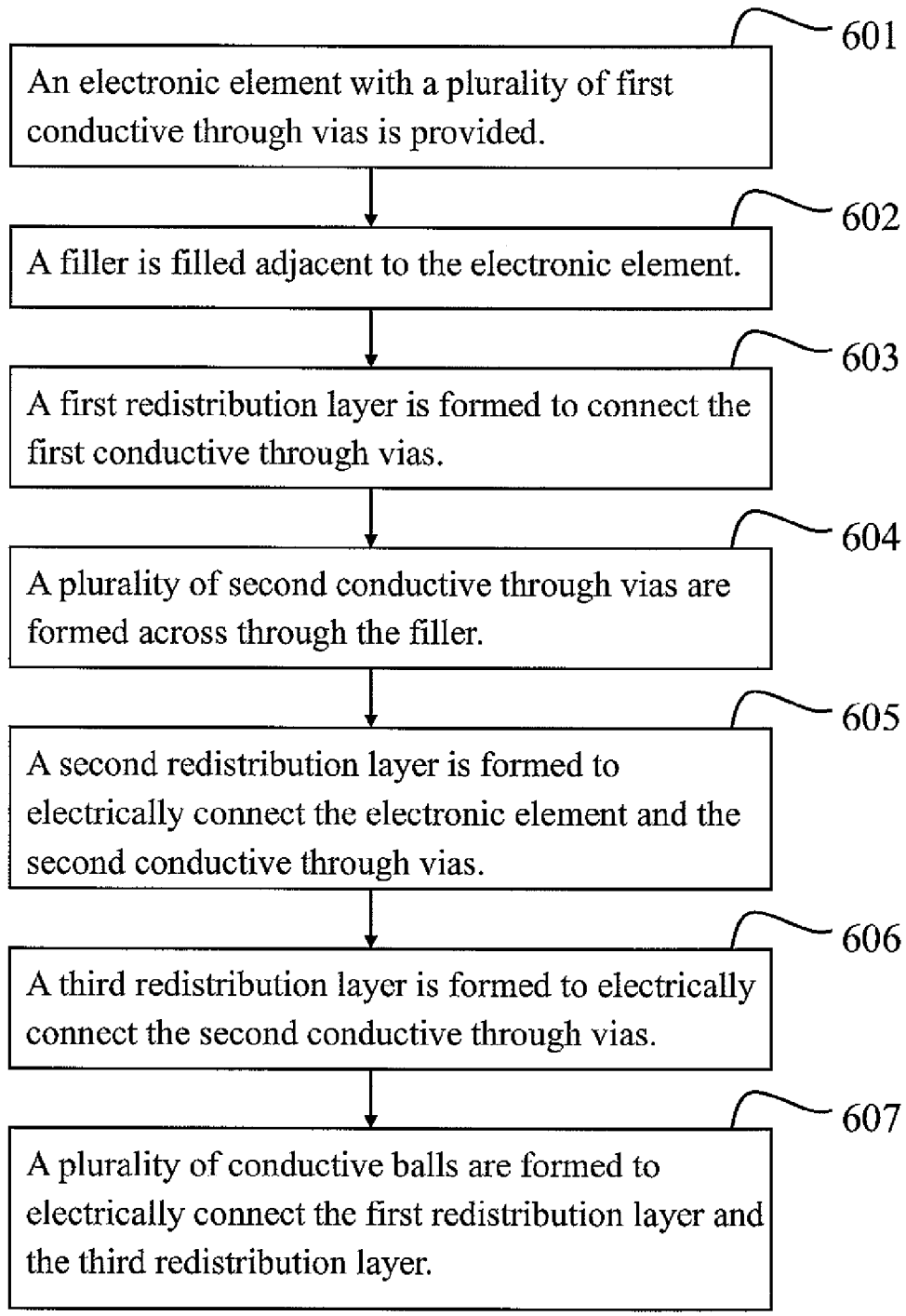
FIG. 6 is a flowchart of manufacturing process of a semiconductor device package structure according to the third embodiment of the present invention.

FIG. 6 shows process steps for manufacturing a semiconductor device package structure according to the third embodiment of the present invention, and illustrates accompanying with FIG. 3 as following:

In step 601, it shows an electronic element 300 with a plurality of first conductive through vias 305 is provided. In this embodiment, the electronic element 300 comprises an active surface and a backside surface. The electronic element 300 further comprises a dielectric layer 303 is formed on the backside surface of the electronic element 300 and a plurality of conductive pads 307 are aligned to the plurality of conductive through vias 305. The conductive through vias 305 are across through the electronic element 305 and the dielectric layer 303. In this embodiment, the dielectric layer 303 is formed for preventing the edge crack of the electronic element 300 at dicing or cutting process, and the dielectric layer 303 can be formed over the wafer by printing or lamination.

In step 602, it shows a filler 315 is filled adjacent to the electronic element 300. In this embodiment, the filler 315 is formed adjacent to the side wall of the electronic element 300 and the side wall of the dielectric layer 303. The filler 315 also refers to a core paste for encapsulating the electronic element 300. In certain embodiments of the present invention, the filling process can be performed by transfer molding or injection molding.

In step 603, it shows a first redistribution layer 317 is formed to connect the first conductive through vias 305. In this embodiment, the first redistribution layer 317 is formed over the dielectric layer 303 and partly of the filler 315. The first redistribution layer 317 is formed by an electroplating, plating or etching method. In certain embodiments of the present invention, the copper (and/or nickel) electroplating operation continues until the copper layer has the desired thickness. In another certain embodiments of the present invention, the deposition of the first redistribution layer 317 uses PVD, CVD, evaporation, electrolytic plating, or electroless plating process.

In step 604, it shows a plurality of second conductive through vias 325 are formed across through the filler 315. In certain embodiments of the present invention, the second conductive through vias 325 with plating Cu/Ni/Au are formed and penetrated from the top to backside of the filler 315. In another certain embodiments of the present invention, the second conductive through vias 325 are formed through the filler 315 by laser drilling, then filled conductive material in the vias. After the second conductive through vias 325 are formed, the first protective layer 311 can be formed to cover and protect the electronic element 300 and the second conductive through vias 325. The first protective layer 311 is formed over the active surface of electronic element 300, the conductive pads 307, the second conductive through vias 325, and partly of the filler 315. In certain embodiments of the present invention, the first protective layer 311 can be formed by molding or gluing method (dispensing or printing).

In step 605, it shows a second redistribution layer 327 is formed to electrically connect the electronic element 300 and the second conductive through vias 325. In this embodiment, the second redistribution layer 327 is formed after a plurality of openings of the first protective layer 311 are formed to expose the conductive pads 307 of the electronic element 300 and the second conductive through vias 325. The second redistribution layer 327 is formed by an electroplating, plating or etching method. In certain embodiments of the present invention, the copper (and/or nickel) electroplating operation continues until the copper layer has the desired thickness. In another certain embodiments of the present invention, the deposition of the second redistribution layer 327 uses PVD, CVD, evaporation, electrolytic plating, or electroless plating process.

In step 606, it shows a third redistribution layer 337 is formed to electrically connect the second conductive through vias 325. The third redistribution layer 337 is formed by an electroplating, plating or etching method. In certain embodiments of the present invention, the copper (and/or nickel) electroplating operation continues until the copper layer has the desired thickness. In another certain embodiments of the present invention, the deposition of the third redistribution layer 337 uses PVD, CVD, evaporation, electrolytic plating, or electroless plating process. After the third redistribution layer 337 is formed, a second protective layer 313 can be formed over the first and third redistribution layers 317 and 327, the exposed dielectric layer 303, and partly of the filler 315. The second protective layer 313 is formed for covering and protecting the first and third redistribution layers 317 and 337. Then, the third protective layer 323 also can be formed over the second redistribution layer 327 and the first protective layer 311. The protective layer 323 is formed for covering and protecting the second redistribution layer 327. In certain embodiments of the present invention, the second and third protective layers 313 and 323 can be formed by molding or gluing method (dispensing or printing).

In step 607, it shows a plurality of conductive balls 319 and 329 are formed to electrically connect the first redistribution layer 317 and the third redistribution layer 337. The plurality of first conductive balls 319 are formed after a plurality of openings of the second protective layer 313 are formed to expose partly section of the first redistribution layer 317; and the plurality of second conductive balls 329 are formed after a plurality of openings of the second protective layer 313 are formed to expose partly section of the conductive through vias 325. In certain embodiments of the present invention, the first and second conductive balls 319 and 329 comprise solder bumps. The solder bumps are electrically and mechanically connected to contact the redistribution layer by a solder reflow process. In another certain embodiments of the present invention, the first and second conductive balls 319 and 329 are reflowed by heating the conductive material above its melting point to form spherical balls or bumps. In some applications, the first and second conductive balls 319 and 329 are reflowed a second time to improve electrical contact to the first and third redistribution layers 317 and 337. Then, the semiconductor device package structure can be performed the redistribution of high pins.

The advantage of above-mentioned embodiments of the present invention is the package size is independent to the chip size and may keep the same ball pitch with the one of the chip. It offers better reliability in via inter-connecting. The chip's active surface is protected during process and it provides better electrical isolation from top surface. Thinner chip is better for reliability and it provides easy processes to form the thinner chips. Side-by-side and stacking package maybe provided easily, it is also easy to fan-out the terminal pins.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

Having described the invention, the following is claimed:

1. A package structure, comprising:
   an electronic element and a plurality of first conductive through vias across through said electronic element, and a plurality of conductive pads accompanying with said first conductive through vias on an active surface of said electronic element;
   a filler material disposed adjacent to said electronic element;
   a first redistribution layer disposed over said filler material, and connected to said first conductive through vias;
   a first protective layer disposed over the active surface of said electronic element, said conductive pads, and said filler material; and
   a second protective layer disposed over said redistribution layer, said dielectric layer, and said filler material.

2. The package structure according to claim 1, wherein said electronic element comprises a semiconductor die or chip.

3. The package structure according to claim 1, wherein said conductive pads comprises bonding pads, terminal contact pads or I/O pads.

4. The package structure according to claim 1, wherein said electronic element which includes a dielectric layer on the backside surface of said electronic element, and said plurality of first conductive through vias across through said electronic element and said dielectric layer.

5. The package structure according to claim 1, wherein said electronic element which includes a dielectric layer on the active surface of said electronic element, and said plurality of first conductive through vias across through said dielectric layer.

6. The package structure according to claim 1, further comprises a metal or alloy base formed outside and adjacent to said filler material and around said package body.

7. The package structure according to claim 1, wherein materials of said first and second protective layers comprise transparent material from soft or hard type.

8. The package structure according to claim 7, further comprises a gap between said first protective layer and said electronic element.

9. The package structure according to claim 1, further comprising:
   a plurality of conductive balls disposed on said second protective layer and connected to said first redistribution layer.

10. The package structure according to claim 9, further comprising:
    a second redistribution layer disposed over said first protective layer, and connected to said conductive pads; and
    a third protective layer disposed over said second redistribution layer and said first protective layer.

11. The package structure according to claim 10, further comprising:
    a plurality of solder bumps disposed on said third protective layer and connected to said second redistribution layer.

12. The package structure according to claim 10, further comprising:
   a plurality of second conductive through vias across through said filler material and connected to said second redistribution layer; and
   a third redistribution layer in the second protective layer and connected to said second conductive through vias.

13. The package structure according to claim 12, further comprising:
   a plurality of conductive balls disposed on said second protective layer and connected to said third redistribution layer.

* * * * *